(12) United States Patent
Liu (10) Patent No.: US 8,456,221 B2
(45) Date of Patent: Jun. 4, 2013

(54) VOLTAGE OPERATION SYSTEM

(75) Inventor: Kai-Yin Liu, Kao Hsiung (TW)

(73) Assignee: Realtek Semiconductor Corp., Hsinchu (TW)

( * ) Notice: Subject to any disclaimer, the term of this patent is extended or adjusted under 35 U.S.C. 154(b) by 27 days.

(21) Appl. No.: 13/087,922

(22) Filed: Apr. 15, 2011

(65) Prior Publication Data

US 2011/0254598 A1    Oct. 20, 2011

(30) Foreign Application Priority Data

Apr. 16, 2010 (TW) ................. 99111978 A (51) Int. Cl.
*H01H 37/76* (2006.01)
*H03K 17/18* (2006.01)

(52) U.S. Cl.
USPC .......................................... 327/525; 327/198

(58) Field of Classification Search
None
See application file for complete search history.

(56) References Cited

U.S. PATENT DOCUMENTS

| 6,134,681 | A  | * | 10/2000 | Akamatsu et al. | 714/710 |
| 6,552,960 | B2 | * | 4/2003  | Shirai et al.   | 365/233.1 |
| 6,992,942 | B2 | * | 1/2006  | Ito             | 365/222 |
| 7,091,768 | B2 | * | 8/2006  | Lee             | 327/525 |
| 2008/0150593 | A1 | | 6/2008 | Chen | |

* cited by examiner

*Primary Examiner* — Lincoln Donovan
*Assistant Examiner* — Terry L Englund
(74) *Attorney, Agent, or Firm* — Muncy, Geissler, Olds & Lowe, PLLC (57) ABSTRACT

A voltage operation system includes: a power on reset circuit, a voltage detecting circuit, an operating signal generating circuit, and an electronic fuse circuit. The power on reset circuit is used for generating a power on reset signal. The voltage detecting circuit detects an operating voltage to output a voltage detecting signal. The operating signal generating circuit, coupled to the power on reset circuit and the voltage detecting circuit-outputs an operating signal. The electronic fuse circuit can be fused according to a lock signal, a fuse signal, and the operating signal.

13 Claims, 7 Drawing Sheets

VOLTAGE OPERATION SYSTEM

This application claims the benefit of the filing date of Taiwan Application Ser. No. 099111978, filed on Apr. 16, 2010, the content of which is incorporated herein by reference.

BACKGROUND OF THE INVENTION (a) Field of the Invention

The present invention relates to a voltage operating system. More specifically, this invention relates to a voltage operating system can detect status of voltage to prevent false action.

(b) Description of the Related Art

A power on reset circuit is usually an analog circuit, so that voltage level has unknown status easily. The voltage level may be too low to make the power on reset circuit, which cannot work in the normal status. Generally, the melting status of a fuse can be decided at initial setting of the electronic fuse system. In other words, a user can decide whether melts down the fuse to change the electronic fuse system voltage level and output different outputs at initial setting.

However, at the transient time of system turning on or turning off, the instantaneous current flows the fuse will be large that could make the fuse melting. Therefore, if the output signal changed by false action, the electronic fuse system cannot adjust system according to the demand of a user.

BRIEF SUMMARY OF THE INVENTION

One object of the present invention is to provide a voltage operating system that can detect a voltage status of a circuit.

One object of the present invention is to provide a voltage operating system that can ensure the circuit working in normal.

One embodiment of the invention discloses a voltage operating system. the voltage operating system comprises: a power on reset circuit, for generating a power on reset signal; a voltage detecting circuit, for detecting a working voltage to output a voltage detecting signal; an operating signal generating circuit, coupled to the voltage detecting circuit and the power on reset circuit to output an operating signal according to the voltage detecting signal and the power on reset signal; and an electronic fuse circuit, for determining the electronic fuse circuit to be melted or not by a locking signal, a melting signal and the operating signal. Wherein, when one of the power on reset signal and the voltage detecting signal is low voltage level, the operating signal is low voltage level, which is outputted from the operating signal generating circuit; and when the power on reset signal and the voltage detecting signal are high voltage levels both, the operating signal is high voltage level, which is outputted from the operating signal generating circuit.

Therefore, the present invention can avoid that the working voltage is too low outputting pulse signal and making the false action. Furthermore, the present invention can avoid the false action making the erroneous output voltage transient which caused by the over current through the electronic fuse.

DETAILED DESCRIPTION OF THE INVENTION

Figure 1:
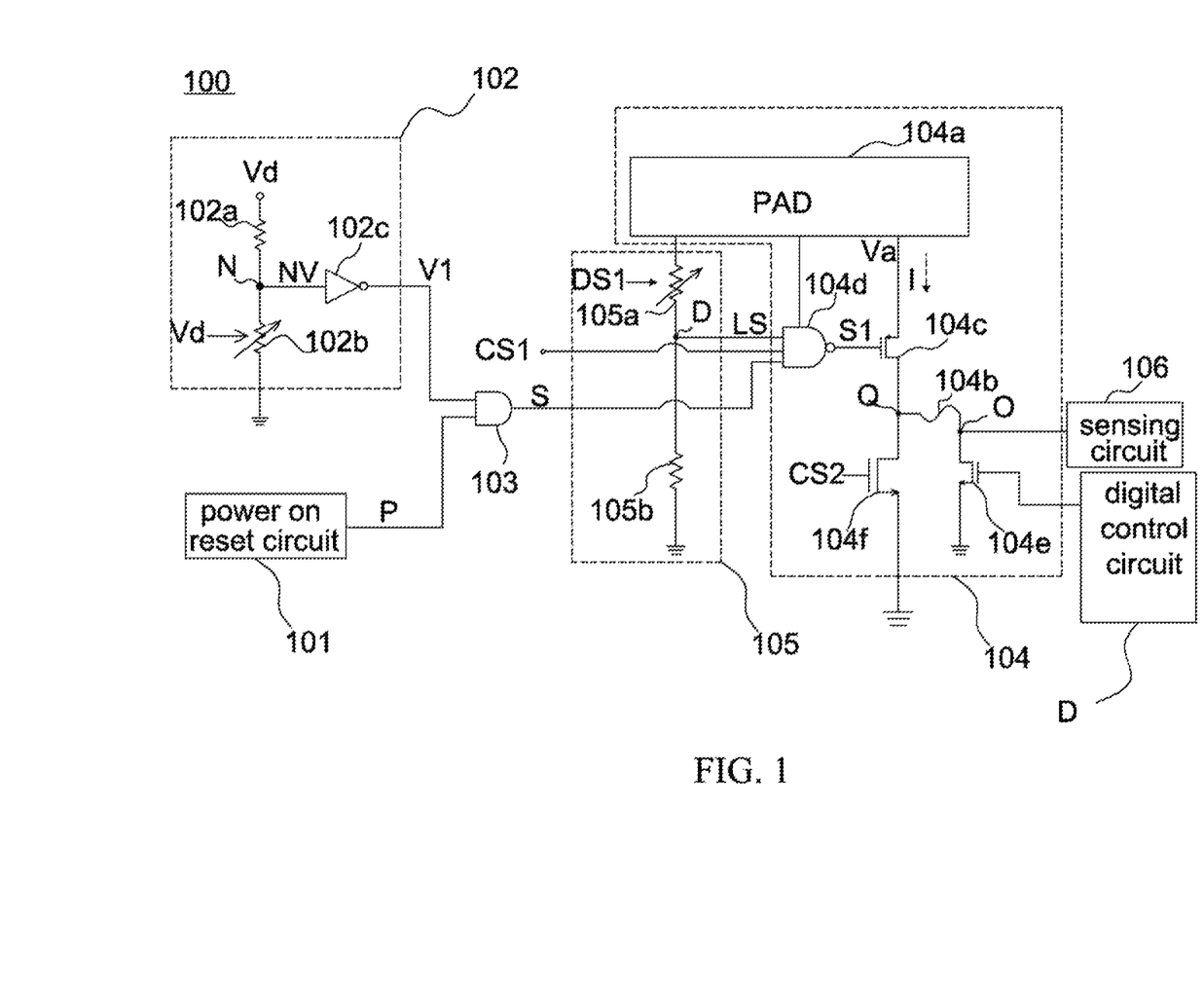
FIG. 1 shows a schematic diagram illustrating a voltage operating system according to one embodiment of the invention.

Please refer to FIG. 1 which shows a schematic diagram illustrating a voltage operating system according to one embodiment of the invention. As shown in FIG. 1, the voltage operating system 100 comprises a power on reset circuit 101, a voltage detecting circuit 102 and an operating signal generating circuit 103.

The power on reset circuit 101 generates a power on reset signal P to the operating signal generating circuit 103; the voltage detecting circuit 102 detect voltage level of a working voltage Vd to output a voltage detecting signal V1, so that voltage level of voltage detecting signal V1 will change with the working voltage Vd; the operating signal generating circuit 103 couples to voltage detecting circuit 102 and power on reset circuit 101. Wherein, operating signal generating circuit 103 receives power on reset signal P and voltage detecting signal V1 to output an operating signal S by power on reset signal P and voltage detecting signal V1.

In one embodiment of the invention, voltage operating system 100 comprises an electronic fuse circuit 104. The electronic fuse circuit 104 couples to operating signal generating circuit 103 to determine electronic fuse circuit 104 melted or not by a locking signal LS, a melting signal CS1 and operating signal S.

In present embodiment, voltage detecting circuit 102 comprises a reference resistor 102a, an adjustable resistor 102b and an inverter 102c. One end of reference resistor 102a couples to working voltage Vd, the other couples to adjustable resistor 102b in series, and the resistance of adjustable resistor 102b can be changed by the working voltage Vd when the voltage detecting circuit 102 being designed as the embodiment shown in FIG. 4.

Inverter 102c coupled to a node N of reference resistor 102a and adjustable resistor 102b, outputted voltage detecting signal V1 according a node voltage NV. The node voltage NV and the voltage detecting signal V1 are inverting each other.

However, when the system is at initial stage of turning on, working voltage Vd is at low voltage level and adjustable resistor 102b is adjusted the resistance which is far greater than reference resistor 102a. The voltage value of node voltage NV will be close to working voltage Vd according to voltage divider theorem. In other words, the voltage of node voltage NV will be raised to high voltage level, and voltage detecting signal V1 outputted from inverter 102c is inverting to node voltage NV. Therefore, voltage detecting signal V1 is at low voltage level.

When working voltage Vd is raised up to steady state, the voltage level of working voltage Vd is greater than before, the resistance of adjustable resistor 102b is adjusted far smaller than reference resistor 102a. Therefore, node voltage NV of node N will be close to zero according to voltage divider theorem. In other words, the voltage level of node voltage NV will reduce to low voltage level, voltage detecting signal V1 will be at high voltage level in the time.

In present embodiment, voltage detecting signal V1 outputted from voltage detecting circuit 102 is determined by reference resistor 102a and adjustable resistor 102b. In other words, voltage level of working voltage Vd is determined by adjustable resistor 102b, and voltage level of voltage detecting signal V1 is determined by working voltage Vd.

After operating signal generating circuit 103 has received power on reset signal P and voltage detecting signal V1, operating signal generating circuit 103 outputs the operating signal S. In the present embodiment, operating signal generating circuit 103 is an AND gate. When voltage detecting signal V1 is low voltage level, no matter what power on reset signal P is at low or high voltage level, operating signal S is still at low voltage level; when the power on reset signal P and the voltage detecting signal V1 are both high voltage levels both, operating signal S is high voltage level, which is outputted from operating signal generating circuit 103.

Therefore, operating signal generating circuit 103 a corresponding output according to power on reset signal P and voltage detecting signal V1, so that when the system is at initial stage of turning on, voltage level of operating signal S is reduced to logic 0. When working voltage Vd is raised up to steady state, operating signal S will be lifted to logic 1.

In the present embodiment, electronic fuse unit 104 comprises a pad 104a, a electronic fuse unit 104b, a switch unit 104c and a control unit 104d.

The pad 104a receives and transports a reference voltage Va. The switch unit104c determines whether a current signal I flows through electronic fuse unit 104 or not according to a switch control signal S1 which controls the conduction. The control unit 104d couples to switch unit 104c and outputs the switch control signal S1 according to a locking signal LS, a melting signal CS1 and operating signal S.

Therefore, electronic fuse unit 104b has low impedance so that electronic fuse unit 104b will be melted when electronic fuse unit 104b receives a higher current signal I, and then the electronic fuse unit 104 forms an open circuit so that electronic fuse unit 104 will change the status.

The electronic fuse unit 104 determines the switch unit 104c be conducted or not according to the switch control signal S1. When the switch unit 104c is conducted, the current signal I flows through the electronic fuse unit 104b from the pad 104a so that changes the output voltage level of the electronic fuse unit 104 changes, and thereby achieve the purpose of the system adjusting.

It is noted that, in one embodiment of present invention, the control unit 104d can be a NAND Gate, and the switch unit 104c can be a PMOSFET. However, the present invention should not be limited as this embodiment.

In the present embodiment, the electronic fuse unit 104 comprises a transistor 104e and a switch unit 104f, wherein transistor 104e can be a NMOSFET. As shown in FIG. 1, one end of electronic fuse unit 104b couples to switch unit 104c in series, the other end couples to transistor 104e in series. Besides, a sensing circuit 106 couples to a node O between the transistor 104e and the electronic fuse unit 104b to receive voltage level of node O. The switch unit 104c, 104f and electronic fuse unit 104b couples to a node Q. However, the gate of transistor 104e couples to a digital control circuit D. Digital control circuit D is to control transistor 104e to be enabled or disabled.

When locking signal generating circuit 105 is unlocked (the locking signal LS is disabled, ex: locking signal LS is logic 1 in this embodiment) and electronic fuse unit 104b is determined no need to melt, in this situation, the melting signal CS1 need keeping at low voltage level. Therefore, the control unit 104d outputs the switch control signal S1 corresponding the high voltage level to switch unit 104c. Then the switch unit 104c is turned-off and the control signal CS2 enables the switch unit 104f to connect ground. In one embodiment, the sensing circuit 106 can determine whether the electronic fuse unit 104b is melted or not by comparing the impedance of electronic fuse unit 104b and a compared resistance (not shown). Because the switching circuit 104f is enabled, sensing circuit 106 will sense a low voltage level at node O.

Besides, as shown in FIG. 1, voltage operating system 100 comprises a locking signal generating circuit 105 generates the locking signal LS. The locking signal generating circuit comprises an adjustable resistor 105a and a reference resistor 105b.

The adjustable resistor 105a couples to reference resistor 105b and pad 104a in series, control unit 104d couples to a node D between adjustable resistor 105a couples to reference resistor 105b. The voltage level of locking signal LS is changed by the impedance of adjustable resistor 105a which is adjusted by adjusting signal DS1.

When locking signal generating circuit 105 is unlocked (the locking signal LS is disabled), the impedance of adjustable resistor 105a is far smaller than reference resistor 105b only by adjusting the adjusting signal DS1. By the voltage divider theorem, voltage level of locking signal LS outputted from node D will be raised to as similar as reference voltage Va. Therefore, voltage level of locking signal LS approximates reference voltage Va. In the present embodiment, control unit 104d can be a NAND gate, control unit 104d is equivalent to an inverter.

When the system is at initial state of turning-on (ex: operating signal S is logic 0 in this embodiment), because operating signal S is at low voltage level, whether locking signal LS and melting signal CS1 are at high voltage level or not, switch control signal S1 outputted form control unit 104d will be at high voltage level.

However, the system is in steady state when turning-on (voltage level of operating signal S is logic 1 in this embodiment), the voltage level of switch control signal 51 outputted from control unit 104d is determined by the voltage level of locking signal LS and melting signal CS1, that because of operating signal S is at high voltage level.

When it is necessary to melt electronic fuse unit 104b, switch unit 104c and transistor 104e are enabled and form a loop. Larger current signal I will flow through switch unit 104c and electronic fuse unit 104b from pad 104a to melt the electronic fuse unit 104b.

However, the system is operated in steady state, the locking signal LS is at low voltage level so that control unit 104d is locked. Because of this situation, whether the melting signal CS1 is at low high voltage level or not, the output from control unit 104d is at high voltage level to the switch unit 104c which cannot be enabled. Therefore, current signal I cannot flow though to melt electronic fuse unit 104b.

In other words, when the working voltage Vd is smaller than a threshold, the voltage detecting signal V1 disables the operating signal generating circuit 103, making the operating signal generating circuit 103 to output the operating signal S at low voltage level; when the working voltage Vd is greater than the threshold, the voltage detecting signal V1 enables the operating signal generating circuit 103, making the operating signal generating circuit 103 to output the operating signal S at high voltage level. In one embodiment of present invention, the threshold can be 2.4V but it should not be limited in the invention.

Therefore, this invention can prevent from node O unpredictably changing voltage status to erroneously melt down electronic fuse unit 104b due to the false action occurred at switch unit 104c and the transistor 104e, which is caused by the transient time when voltage operating system 100 power-on or power-off.

Figure 2A:
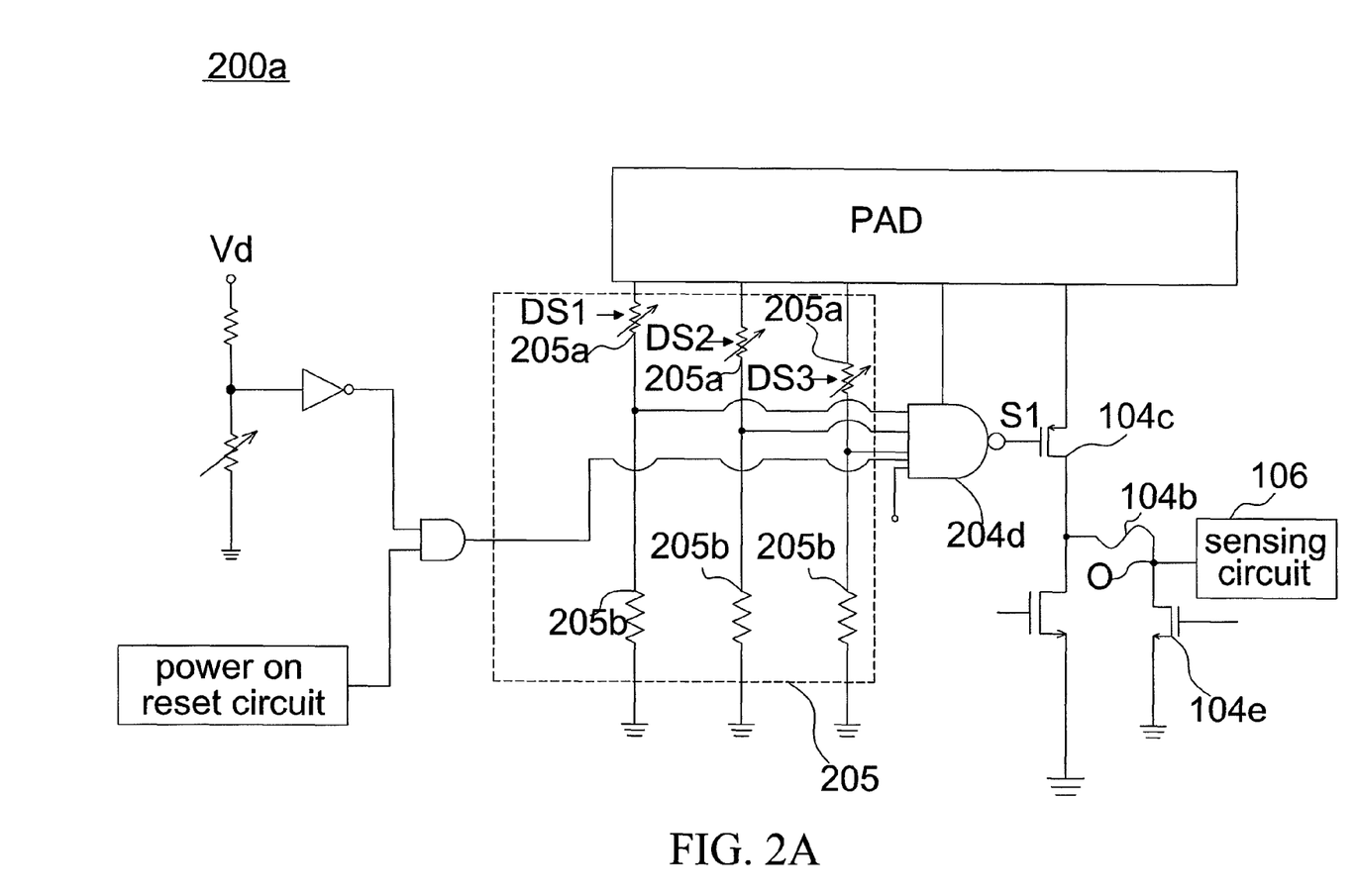
FIG. 2A shows a schematic diagram illustrating a voltage operating system according to one embodiment of the invention.

Please refer to FIG. 2A, which shows a schematic diagram illustrating a voltage operating system 200a according to one embodiment of the invention. The difference between the voltage operating system 200a and voltage operating system 100 is locking signal generating circuit 205 including three adjustable resistors 205a and three reference resistors 205b. The structure and connection are shown in FIG. 2A.

Therefore, a user need to adjust three adjusting signals DS1, DS2, DS3 to make the impedance of the three adjustable resistors 205a more greater than the three reference resistors 205b so that the switch control signal S1 outputted from the control unit 204d is low voltage level. To prevent the false action making electronic fuse unit 104b being erroneously melted, which occurred at switch unit 104c and transistor 104e, the user only need to adjust one of the voltage level of adjusting signals DS1, DS2, DS3 to a low voltage level. Thus, the voltage operating system 200a can prevent from the false action due to the voltage level of node O changing unpredictably by multiple level protection. In other words, the system can increase the locking probability to prevent from the problem that the system cannot get locked. Other operational principles are the same as aforementioned, detail description is omitted here for sake of brevity.

Figure 2B:
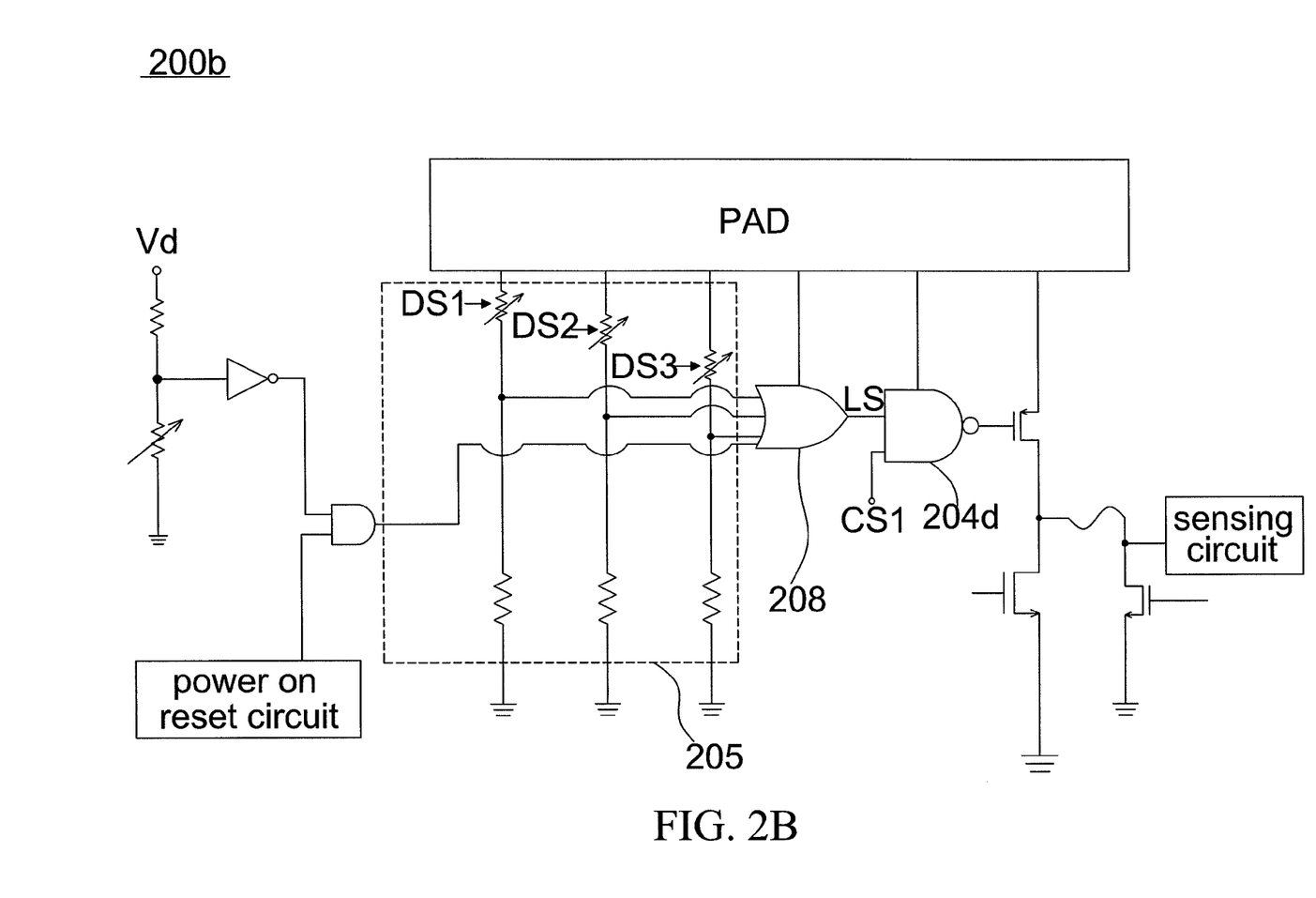
FIG. 2B shows a schematic diagram illustrating a voltage operating system according to one embodiment of the invention.

Please refer to FIG. 2B, FIG. 2B shows a schematic diagram illustrating a voltage operating system 200b according to one embodiment of the invention. The difference between the voltage operating systems 200a and 200b is that the voltage operating system 200b includes an OR gate 208. OR gate 208 couples to the locking signal generating circuit 205 and outputs the locking signal LS to the control unit 204d. The control unit 204d outputs the switch control signal S1 according to locking signal LS and melting signal CS1.

In this embodiment, when one of adjusting signals DS1, DS2, DS3 is high voltage level, the locking signal LS outputted by OR gate 208 will be high voltage level. This embodiment comparison with voltage operating system 200a has a feature that this embodiment can prevent from the erroneously locking. Therefore, it is assumed that adjusting signals DS1, DS2, DS3 are controlled by three different users, when one of the three users would like to melt electronic fuse unit 104b, it only need to make one of adjusting signals DS1, DS2, DS3 operated at high voltage level, no need to make all of adjusting signals DS1, DS2, DS3 operated at high voltage level. Other operational principles are the same as aforementioned, detail description is omitted here for sake of brevity.

Figure 3:
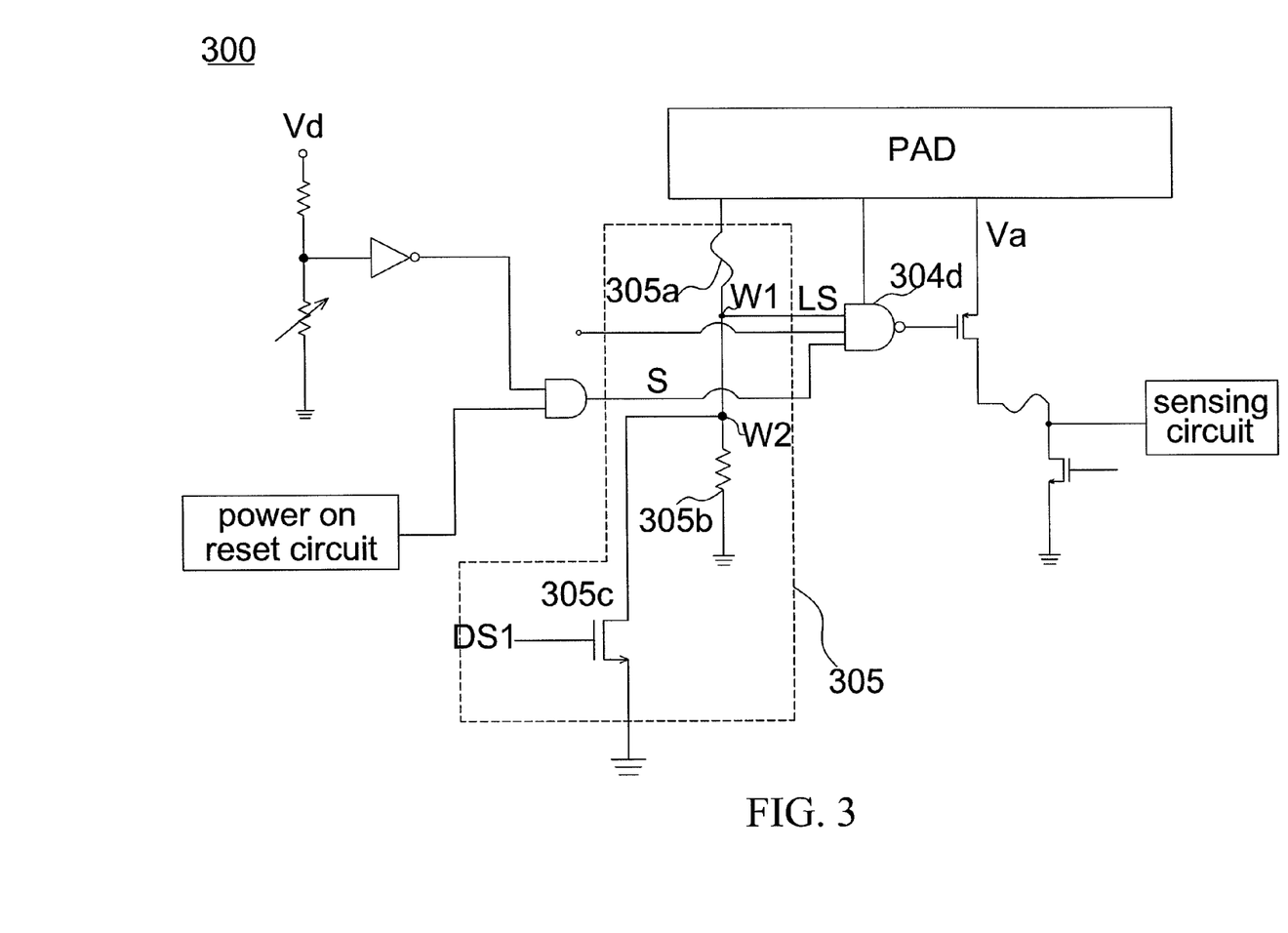
FIG. 3 shows a schematic diagram illustrating a voltage operating system according to one embodiment of the invention.

Please refer to FIG. 3. FIG. 3 shows a schematic diagram illustrating a voltage operating system according to one embodiment of the invention. It is to be noted that, voltage operating systems 300 and 100 have similar function, the difference is that locking signal generating circuit 305 includes a adjusting fuse 305a, a reference resistor 305b and a switching circuit 305c.

Adjusting fuse 305a couples reference resistor 305b in series, and couples to pad 104a and receives reference voltage Va; control circuit 304d couples to a node W1 between adjusting fuse 305a and reference resistor 305b; switching circuit 305c couples to a node W2 between adjusting fuse 305a and reference resistor 305b; and node W1 outputs locking signal LS. In this embodiment, node W1 and node W2 are substantially the same and switching circuit 305c is a NMOSFET.

When the initial value of adjusting signals DS1 is at low voltage level, the switching circuit 305c is disabled. According to the voltage divider theorem, the voltage level of node W1 will be very closed to reference Va when the impedance of adjusting fuse 305a far smaller than reference resistor 305b. Accordingly, locking signal LS is at high voltage level and the function of control circuit 304d is like an inverter.

When determining to lock locking signal generating circuit 305, user controls adjusting signals DS1 operated at high voltage level so that the switching circuit 305c can be enabled. The voltage level of node W1 will be pulled down to a low voltage level. Due to the cross voltage between adjusting fuse 305a is large and the resistance of adjusting fuse 305a is small, the current signal I flows through adjusting fuse 305a will be very large to melt down the adjusting fuse 305a. Furthermore, the voltage of node W1 will keep at low voltage level and control circuit 304d will be locked.

Therefore, user can utilize adjusting signal DS1 to control the operation of switching circuit 305c so as to control the voltage level of locking signal LS, and also can make the voltage level of locking signal LS operating at low voltage level permanently by melting down adjusting fuse 305a. Other operational principles are the same as aforementioned, detail description is omitted here for sake of brevity.

Figure 4:
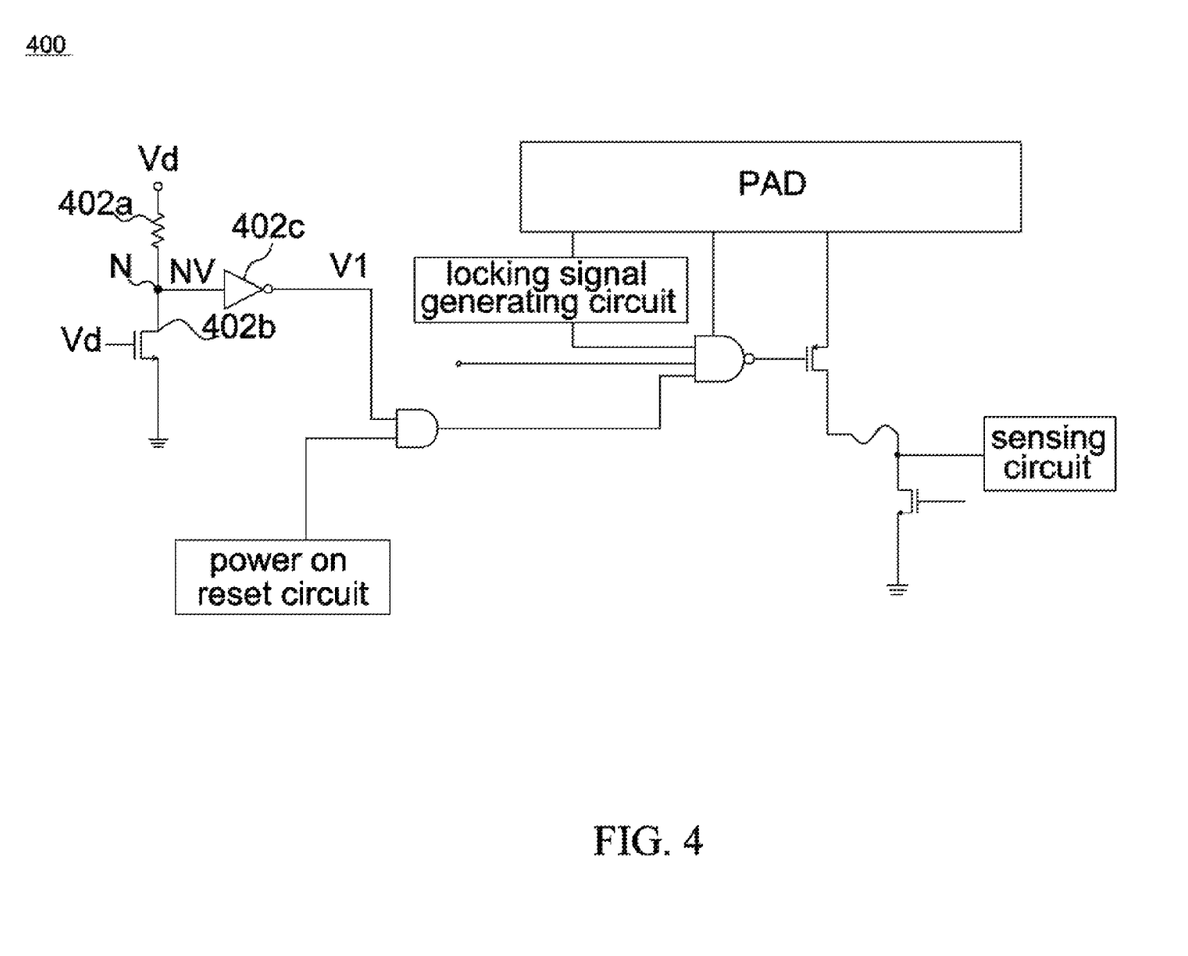
FIG. 4 shows a schematic diagram illustrating a voltage operating system according to one embodiment of the invention.

Please refer to FIG. 4. FIG. 4 shows a schematic diagram illustrating a voltage operating system according to one embodiment of the invention. It is to be noted that, voltage operating systems 400 and 100 have similar function, the difference is that adjustable resistor 402b can be a NMOSFET.

The gate of adjustable resistor 402b couples to working voltage Vd. When working voltage Vd is smaller than or equal to threshold voltage Vth, the adjustable resistor 402b is disabled because of the operation is in cut-off status. Therefore, the impedance of adjustable resistor 402b will be far greater than reference resistor 402a. The node voltage NV of node N will be very close to working voltage Vd. In other words, voltage level of node voltage NV is raised to high voltage level and the output voltage of inverter 402c is reverse with node voltage NV so that voltage detecting signal V1 is at low voltage level.

When working voltage Vd is far greater than threshold voltage Vth, the adjustable resistor 402b is enabled because of the operation is in triode region. Therefore, the impedance of adjustable resistor 402b will be far smaller than reference resistor 402a. The node voltage NV of node N will be very close to zero. In other words, voltage level of node voltage NV is pulled down to low voltage level and voltage detecting signal V1 is at high voltage level. Other operational principles are the same as aforementioned, detail description is omitted here for sake of brevity.

Figure 5:
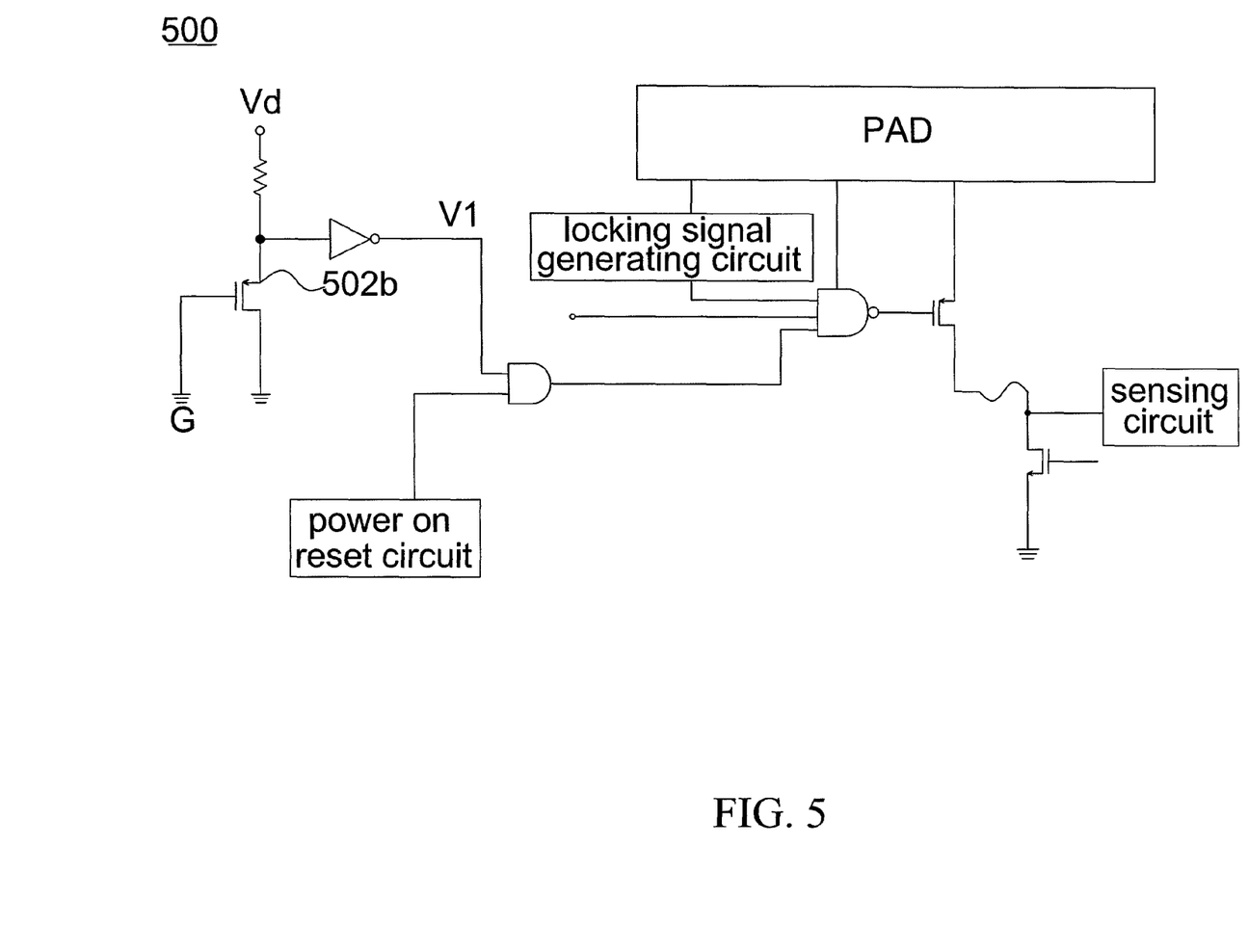
FIG. 5 shows a schematic diagram illustrating a voltage operating system according to one embodiment of the invention.

Please refer to FIG. 5. FIG. 5 shows a schematic diagram illustrating a voltage operating system 500 according to one embodiment of the invention. The difference between the voltage operating systems 500 and 100 is that the adjustable resistor 502b can be a PMOSFET. The gate of adjustable resistor 502b couples to ground G to ensure that voltage detecting signal V1 is at low voltage level when the system is at initial stage of turning on. Other operational principles are the same as aforementioned, detail description is omitted here for sake of brevity.

Figure 6:
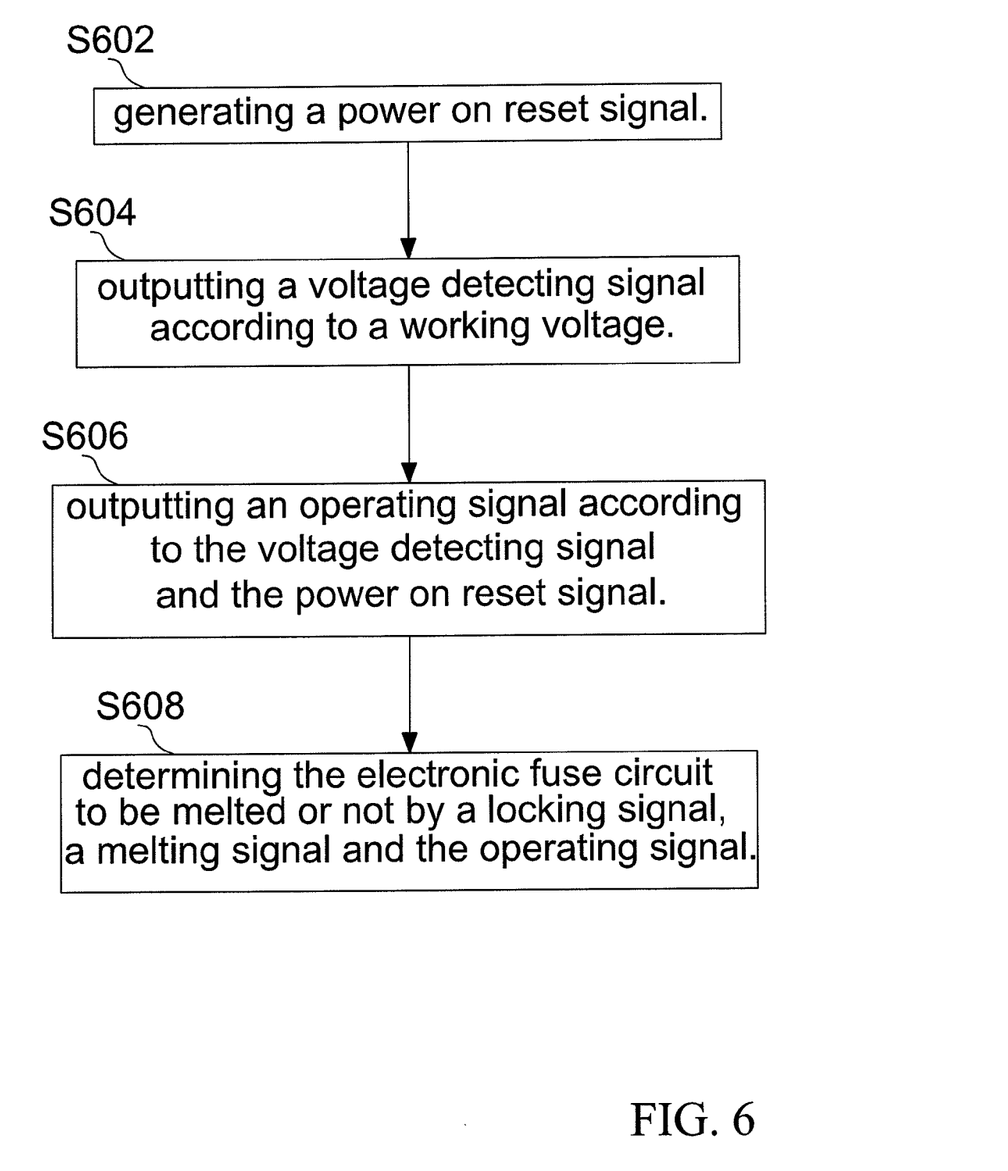
FIG. 6 shows a schematic diagram illustrating a voltage operating system according to one embodiment of the invention.

Referring to FIG. 6, a voltage operating method according to one embodiment of the invention. The voltage operating method includes the steps as described below.

In step S602, generating a power on reset signal;

In step S604, outputting a voltage detecting signal according to a working voltage;

In step S606, outputting an operating signal according to the voltage detecting signal and the power on reset signal; and In step S608, determining the electronic fuse circuit to be melted or not by a locking signal, a melting signal and the operating signal.

In sum, the present invention can avoid that the working voltage is too low outputting pulse signal and making the false action. Furthermore, the present invention can avoid the false action making the erroneous output voltage transient which caused by the over current through the electronic fuse.

What is claimed is:

1. A voltage operating system, comprising:
   a power on reset circuit, for generating a power on reset signal;
   a voltage detecting circuit, for detecting a working voltage to output a voltage detecting signal;
   an operating signal generating circuit, coupled to the voltage detecting circuit and the power on reset circuit to output an operating signal according to the voltage detecting signal and the power on reset signal; and
   an electronic fuse circuit is used to be melted or not according to a locking signal, a melting signal and the operating signal.

2. The voltage operating system according to claim 1, wherein when one of the power on reset signal and the voltage detecting signal is low voltage level, the operating signal is low voltage level, which is outputted from the operating signal generating circuit; and when the power on reset signal and the voltage detecting signal are both high voltage levels, the operating signal is high voltage level, which is outputted from the operating signal generating circuit.

3. The voltage operating system according to claim 1, wherein the operating signal generating circuit is an AND gate.

4. The voltage operating system according to claim 3, wherein the voltage detecting circuit comprises:
   a reference resistor, one end of the reference resistor couples to the working voltage;
   an adjustable resistor, coupled to the reference resistor in series; and
   an inverter, coupled to a node of the reference resistor and the adjustable resistor, to output the voltage detecting signal according a node voltage;
   wherein, the voltage of the node voltage is determined by resistance of the reference resistor and the adjustable resistor, and the node voltage and the voltage detecting signal are inverted versions of each other.

5. The voltage operating system according to claim 4, wherein the electronic fuse circuit comprises:
   an electronic fuse unit, for changing an output voltage level when a current signal passes through the electronic fuse unit;
   a first switch unit, coupled between a pad and the electronic fuse unit, for determining the current signal to pass through the electronic fuse unit or not according to a switch control signal; and
   a control unit, coupled to the first switch unit and outputting the switch control signal according to the locking signal, the melting signal and the operating signal;
   wherein, the electronic fuse unit is melted or not according to the melting signal; when the melting signal is false action, the locking signal is utilized to lock the control unit to avoid an erroneous switch control signal from being; generated by the control unit.

6. The voltage operating system according to claim 5, wherein the working voltage can be utilized to adjust resistance of the adjustable resistor.

7. The voltage operating system according to claim 5, wherein the control unit is a NAND gate.

8. A voltage operating method, comprising:
   generating a power on reset signal;
   outputting a voltage detecting signal in a response to a working voltage;
   outputting an operating signal in a response to the power on reset signal and the voltage detecting signal; and
   determining if an electronic fuse circuit is melted or not by a locking signal, a melting signal and the operating signal;
   wherein, when one of the power on reset signal and the voltage detecting signal is low voltage level, the operating signal is low voltage level, which is outputted from an operating signal generating circuit; and when the power on reset signal and the voltage detecting signal are high voltage levels both, the operating signal is high voltage level, which is outputted from the operating signal generating circuit.

9. The voltage operating method according to claim 8, wherein the procedures which according to the working voltage to output the voltage detecting signal comprises:
   adjusting resistance of an adjustable resistor; and
   outputting a node voltage by voltage divider theorem;
   wherein the node voltage and the voltage detecting signal are backward signals.

10. A voltage operating system comprises:
    a power on reset circuit, for generating a power on reset signal;
    a voltage detecting circuit, for detecting a working voltage to output a voltage detecting signal;
    an operating signal generating circuit, coupled to the voltage detecting circuit and the power on reset circuit to output an operating signal according to the voltage detecting signal and the power on reset signal; and
    an electronic fuse circuit is used to be melted or not according to a melting signal and the operating signal;
    wherein, when the working voltage is smaller than a threshold, the voltage detecting signal disables the operating signal generating circuit, making the operating signal generating circuit to output the operating signal at low voltage level; when the working voltage is greater than the threshold, the voltage detecting signal enables the operating signal generating circuit, making the operating signal generating circuit to output the operating signal at high voltage level.

11. The voltage operating system according to claim 10, wherein the operating signal generating circuit is an AND gate.

12. The voltage operating system according to claim 11, wherein the voltage detecting circuit comprises:
    a reference resistor, one end of the reference resistor couples to the working voltage;
    an adjustable resistor, coupled to the reference resistor in series; and
    an inverter, coupled to a node of the reference resistor and the adjustable resistor and outputting the voltage detecting signal according a node voltage;
    wherein, the voltage of the node voltage is determined by resistance of the reference resistor and the adjustable resistor, and the node voltage and the voltage detecting signal are backward signals.

13. The voltage operating system according to claim 12, wherein the electronic fuse circuit comprises:
- an electronic fuse unit, for changing an output voltage level when a current signal passes through the electronic fuse unit;
- a first switch unit, coupled between a pad and the electronic fuse unit, for determining the current signal to pass through the electronic fuse unit or not according to a switch control signal; and
- a control unit, coupled to the first switch unit and outputting the switch control signal according to a locking signal, the melting signal and the operating signal;
- wherein, the electronic fuse unit is to be melted or not according to the melting signal;
- when the melting signal is false action, the locking signal is utilized to lock the control unit to avoid an erroneous switch control signal from being generated by the control unit.

* * * * *